US010601411B2

(12) United States Patent
Goya et al.

(10) Patent No.: US 10,601,411 B2
(45) Date of Patent: Mar. 24, 2020

(54) COMPARATOR

(71) Applicant: KABUSHIKI KAISHA TOSHIBA, Tokyo (JP)

(72) Inventors: Seiichi Goya, Yokohama Kanagawa (JP); Hideaki Uchida, Sagamihara Kanagawa (JP); Norihiro Ueda, Kawasaki Kanagawa (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 0 days.

(21) Appl. No.: 15/694,833

(22) Filed: Sep. 3, 2017

(65) Prior Publication Data

US 2018/0226960 A1    Aug. 9, 2018

(30) Foreign Application Priority Data

Feb. 7, 2017 (JP) .................................. 2017-020663

(51) Int. Cl.
*H03K 5/24* (2006.01)
*G01R 19/10* (2006.01)
*H03K 5/19* (2006.01)
*H03K 19/0185* (2006.01)

(52) U.S. Cl.
CPC .......... *H03K 5/2481* (2013.01); *G01R 19/10* (2013.01); *H03K 5/19* (2013.01); *H03K 5/2472* (2013.01); *H03K 19/018507* (2013.01)

(58) Field of Classification Search
CPC .. H03K 5/2481; H03K 5/2445; H03K 5/2418; H03K 5/24; H03K 5/2472
See application file for complete search history.

(56) References Cited

U.S. PATENT DOCUMENTS

| 5,548,227 | A | | 8/1996 | Minami | |
|---|---|---|---|---|---|
| 6,008,674 | A | * | 12/1999 | Wada | G11C 5/147 327/77 |
| 6,801,080 | B1 | * | 10/2004 | Arcus | H03K 5/2481 327/379 |
| 6,940,318 | B1 | * | 9/2005 | Wong | H03K 5/08 327/77 |
| 7,233,174 | B2 | * | 6/2007 | Martins | H03K 5/2481 327/63 |

(Continued)

FOREIGN PATENT DOCUMENTS

JP    H07198760 A    8/1995
JP    2008-219655 A    9/2008

(Continued)

OTHER PUBLICATIONS

Japanese Office Action dated Oct. 1, 2019, mailed in counterpart Japanese Application No. 2017-020663, 8 pages (with translation).

*Primary Examiner* — Thomas J. Hiltunen
(74) *Attorney, Agent, or Firm* — Kim & Stewart LLP

(57) ABSTRACT

A comparator includes a differential pair circuit comprising NMOS transistors, the differential pair circuit configured to output a signal corresponding to a difference between first and second input signals supplied thereto, and an input circuit configured to raise a voltage level of the first input signal supplied to the differential pair circuit when the voltage of the first input signal is less than a predetermined threshold value.

19 Claims, 3 Drawing Sheets

(56) References Cited

U.S. PATENT DOCUMENTS

| | | | |
|---|---|---|---|
| 7,589,568 B2* | 9/2009 | Steedman | G01R 19/16552 327/143 |
| 7,592,868 B2 | 9/2009 | Hasegawa | |
| 7,995,977 B2* | 8/2011 | Kim | H03G 3/3052 327/543 |
| 8,847,632 B2* | 9/2014 | Suzuki | H03K 5/01 326/30 |
| 8,917,136 B1* | 12/2014 | Pelley | H02M 1/36 327/536 |
| 9,933,494 B2* | 4/2018 | Mitani | G01R 31/40 |
| 2002/0030515 A1* | 3/2002 | Garnier | H03F 1/0244 327/63 |
| 2002/0075074 A1 | 6/2002 | Wang et al. | |
| 2004/0196231 A1* | 10/2004 | Goto | G09G 3/3688 345/87 |
| 2009/0085788 A1* | 4/2009 | Yamazaki | H03F 3/45183 341/153 |
| 2011/0199360 A1* | 8/2011 | Fujiwara | G09G 3/3688 345/211 |
| 2012/0133396 A1* | 5/2012 | Liu | H03K 5/2481 327/63 |
| 2016/0169947 A1* | 6/2016 | De Fazio | G01R 19/10 327/59 |
| 2016/0322965 A1* | 11/2016 | Elran | H03K 17/687 |
| 2017/0093387 A1* | 3/2017 | Zhu | H03K 5/2472 |

FOREIGN PATENT DOCUMENTS

| | | |
|---|---|---|
| JP | 2011166555 A | 8/2011 |
| JP | 2012-199664 A | 10/2012 |
| JP | 2013-090136 A | 5/2013 |

* cited by examiner

COMPARATOR

CROSS-REFERENCE TO RELATED APPLICATION

This application is based upon and claims the benefit of priority from Japanese Patent Application No. 2017-020663, filed Feb. 7, 2017, the entire contents of which are incorporated herein by reference.

FIELD

Embodiments described herein relate generally to a comparator.

BACKGROUND

In the related art, as an input circuit of an analog semiconductor integrated circuit, there is a rail-to-rail type input circuit that sets an input voltage level of a differential pair circuit to be within a wide range of voltages ranging from a power supply voltage to a ground voltage. A differential pair circuit including NMOS transistors and a differential pair circuit including PMOS transistors are combined, and a wide input voltage range of the input circuit is secured by using an output of the NMOS differential pair circuit when the input voltage level approximates the power supply voltage and using an output of the PMOS differential pair circuit when the input voltage level approximates the ground level.

When the rail-to-rail type input circuit is used as an input circuit of the comparator, one of two input signals may be a reference signal which is a DC bias signal, and the other may be a monitoring target signal. The comparator operates such that an output signal is inverted when the monitoring target signal is equal to or higher than, or is equal to or lower than, the reference signal.

There is a problem that the PMOS transistor that receives a DC reference signal having a low voltage level is likely to be influenced by negative-bias temperature instability (hereinafter, abbreviated to NBTI) degradation. In the PMOS differential pair circuit of the comparator, the NBTI degradation of the PMOS transistor which receives the DC reference signal is greater than that of the PMOS transistor that receives the monitoring target signal. Thus, the balance of the differential pair is lost by a difference between the degree of NBTI degradation of two inputs of the PMOS differential pair circuit, and thus, the detection accuracy of the comparator is deteriorated.

DETAILED DESCRIPTION

Embodiments provide a comparator which remains operable despite an input signal falling within a wide input voltage range, is minimally influenced by NBTI degradation, and has a reduced circuit size.

In general, according to one embodiment, a comparator includes a differential pair circuit comprising NMOS transistors, the differential pair circuit configured to output a signal corresponding to a difference between first and second input signals supplied thereto, and a first input circuit configured to raise a voltage of the first input signal supplied to the differential pair circuit when the voltage of the first input signal is less than a predetermined threshold value.

Hereinafter, an embodiment will be described with reference to the drawings.

Configuration

Figure 1:
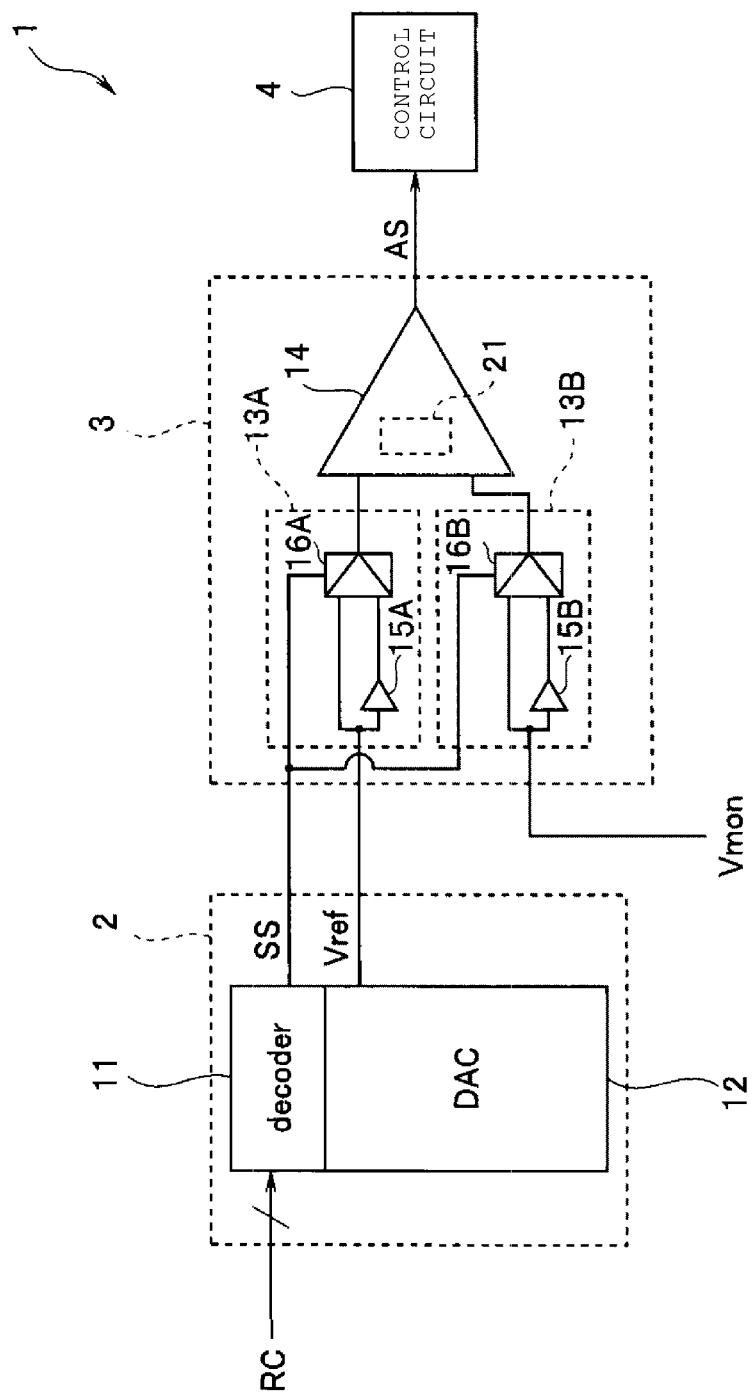
FIG. 1 is a block diagram of a voltage monitoring device according to an embodiment.

FIG. 1 is a block diagram of a voltage monitoring device according to the present embodiment.

A voltage monitoring device 1 includes a digital-to-analog converter (hereinafter, referred to as a DAC unit) 2, a comparator 3, and a control circuit 4. Two input signals are input to the voltage monitoring device 1. One of the two input signals is a reference code signal RC which is a digital signal, and the other is an input signal Vmon which is a monitoring target. For example, the reference code signal RC is a digital signal indicating the voltage value of a reference signal Vref as a threshold, and is set by a level setting code CODE.

For example, the voltage monitoring device 1 monitors the input signal Vmon by using the comparator 3, and outputs a predetermined detection signal AS to the control circuit 4 when the input signal Vmon is equal to or less than the voltage value of the reference signal Vref. For example, when the input signal Vmon is equal to or less than the voltage value of the reference signal Vref, the voltage monitoring device 1 provides a voltage abnormality detection device which outputs a predetermined detection signal AS as an abnormality detection signal to the control circuit 4. The comparator 3 is an analog semiconductor integrated circuit including a differential pair circuit. The control circuit 4 outputs a control signal to another device (not shown) based on the detection signal AS.

Figure 2:
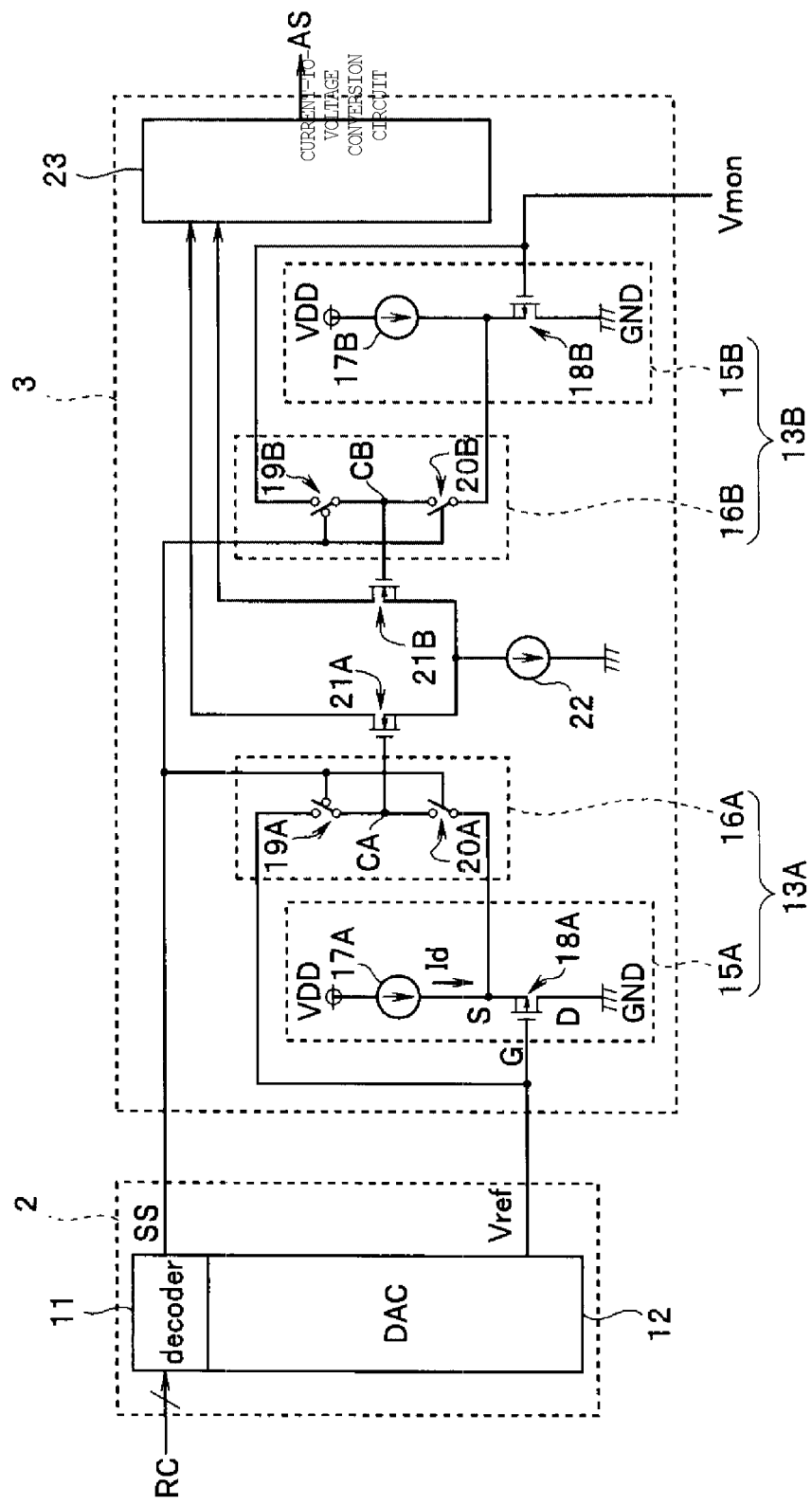
FIG. 2 is a circuit diagram of a DAC unit and a comparator according to the embodiment.

A specific circuit configuration of the voltage monitoring device 1 will be described with reference to FIG. 2. FIG. 2 is a circuit diagram of the DAC unit 2 and the comparator 3.

The DAC unit 2 includes a decoder 11 and a digital-to-analog converter (hereinafter, abbreviated to DAC) 12. The reference code signal RC is input to the DAC unit 2.

The decoder 11 generates a predetermined selection signal SS depending on the value of the input reference code signal RC, and outputs the generated selection signal to the comparator 3. In this example, a selection signal SS is selected based on whether or not the value of the reference code signal RC is equal to or greater than a predetermined value TH is output from the DAC unit 2.

The DAC 12, as a portion of the DAC unit 2, receives the digital reference code signal RC, converts the received reference code signal into the reference signal Vref which is an analog signal, and outputs the converted reference signal to the comparator 3.

Thus, the DAC unit 2 receives the reference code signal RC which is the digital signal, generates the selection signal SS, and outputs the generated selection signal to the comparator 3, and generates the reference signal Vref corresponding to the reference code signal RC and outputs the generated reference signal to the comparator 3. Likewise, the DAC 12 thus converts the reference code signal RC which is a digital signal to an analog signal, and generates the reference signal Vref. Thus, a voltage of the reference signal Vref may be set and changed by the level setting code CODE.

As shown in FIG. 1, the comparator 3 includes input circuits 13A and 13B, and a differential amplifier 14. An output of the DAC 12 is input, as the reference signal Vref, to the differential amplifier 14 through the input circuit 13A.

The input circuit 13A that receives the reference signal Vref includes a buffer circuit 15A, and a multiplexer 16A. The input circuit 13B receives the input signal Vmon, and it includes a buffer circuit 15B, and a multiplexer 16B. The selection signal SS is input to the multiplexers 16A and 16B.

The reference signal Vref is input to the buffer circuit 15A. As shown in FIG. 2, the buffer circuit 15A includes a current source 17A and a PMOS transistor 18A which are provided between a power supply voltage (VDD) and ground (GND). The drain of the PMOS transistor 18A is connected to ground, and the current source 17A is connected to the source of the PMOS transistor 18A. The reference signal Vref is supplied to the gate of the PMOS transistor 18A. The current source 17A supplies a constant current that saturates the PMOS transistor 18A.

The buffer circuit 15A serves as a level shift circuit that shifts the voltage level of the reference signal Vref up so as to raise the voltage level thereof to a voltage shifted or increased reference signal Vref+. The buffer circuit 15A includes the PMOS transistor 18A.

The multiplexer 16A includes two switches 19A and 20A. The two switches 19A and 20A are analog switches. One terminal of the switch 19A is connected to the gate of the PMOS transistor 18A such that the reference voltage signal in the non-shifted state (hereinafter, referred to as a reference signal) Vref is supplied to the one terminal thereof. The other terminal of the switch 19A is connected to a connection node or point CA of the switch 19A and the switch 20A.

One terminal of the switch 20A is connected to the source of the PMOS transistor 18A which is the shifted voltage reference signal Vref+ output of the buffer circuit 15A. The other terminal of the switch 20A is connected to the connection point CA of the switches 19A and 20A.

The multiplexer 16A selectively opens and closes the switches 19A and 20A depending on the selection signal SS, and operates so as to apply only one of the voltage shifted reference signal Vref+ output from the buffer circuit 15A, or the reference signal Vref in the un-shifted state, to the connection point CA. As shown in FIG. 2, switching communication with the connection point CA, and thus the output of the connection point CA, between the un-shifted reference signal Vref voltage present at the gate of the PMOS transistor 18A, and the shifted reference voltage Vref+ output from the source of the PMOS transistor 18A, is performed depending on the selection signal SS.

Specifically, the multiplexer 16A serves as a selection circuit which selects the voltage shifted reference signal Vref+ having a voltage value shifted up, i.e., increased, by the buffer circuit 15A when the voltage level of the reference signal Vref is less than a voltage VTH, which is a preselected or predetermined threshold voltage, and selects the un-shifted reference signal Vref when the voltage level of the reference signal Vref is not less than the voltage VTH, and supplies the selected one of these reference signals to an NMOS differential pair circuit 21.

On an input path of the input signal Vmon which is the monitoring target, the buffer circuit 15B and the multiplexer 16B are provided in order to achieve symmetry between the lengths of the input path of the input signal Vmon and an input path of the reference signal Vref.

The input signal Vmon is input to the buffer circuit 15B. The buffer circuit 15B that receives the input signal Vmon which is the monitoring target includes a current source 17B and a PMOS transistor 18B which are provided between a power supply voltage (VDD) and ground (GND). The drain of the PMOS transistor 18B is connected to ground, and the current source 17B is connected to the source of the PMOS transistor 18B. The input signal Vmon is supplied to the gate of the PMOS transistor 18B.

The PMOS transistors 18A and 18B are paired, and the physical parameters thereof such as their threshold voltages Vth and sizes of the transistors match.

The current source 17B supplies a constant current that saturates the PMOS transistor 18B. Current values of constant currents Id of the current sources 17A and 17B are set to be equal.

The buffer circuit 15B serves as a level shift circuit that shifts the voltage value of the input signal Vmon up so as to raise the voltage level thereof to the value Vmon+. The buffer circuit 15B includes the PMOS transistor 18B.

The multiplexer 16B includes two switches 19B and 20B. One terminal of the switch 19B is connected to the gate of the PMOS transistor 18B such that the input signal Vmon which is the monitoring target is supplied to the one terminal thereof. The other terminal of the switch 19B is connected to a connection point CB of the switches 19B and 20B.

One terminal of the switch 20B is connected to the source of the PMOS transistor 18B which is the output of the buffer circuit 15B. The other terminal of the switch 20B is connected to the connection point CB of the switches 19B and 20B.

The multiplexer 16B selectively opens and closes the switches 19B and 20B depending on the magnitude of the selection signal SS, and operates so as to apply only one of the output of the buffer circuit 15B Vmon+ or the input signal Vmon to the connection point CB. As shown in FIG. 2, switching communication of the connection point CB, and thus the output of the connection point CB, between the un-shifted voltage Vmon present at the gate of the PMOS transistor 18B, and the shifted voltage Vmon+ output from the source of the PMOS transistor 18B is performed depending on the magnitude of the selection signal SS.

Specifically, the multiplexer 16B serves as a second selection circuit which selects the voltage shifted input signal Vmon+ shifted up by the buffer circuit 15B when the voltage level of the reference signal Vref is less than the voltage VTH which is the predetermined threshold voltage, and selects the un-shifted input signal Vmon when the voltage level of the reference signal Vref is not less than the voltage VTH which is the predetermined threshold voltage, and supplies the selected input signal to the NMOS differential pair circuit 21.

In this case each multiplexer 16A and 16B, which is configured as a selection circuit, selects which of an input signal shifted up by the level shift circuit (Vref+, Vmon+) or the un-shifted input signal (Vref, Vmon) based on the selection signal SS, and supplies the selected input signal to the NMOS differential pair circuit 21. Thus, the decoder 11 serves as a selection instruction circuit that outputs the selection signal SS to the multiplexers 16A and 16B based on the voltage of the digital signal which is the reference signal Vref.

The buffer circuits 15A and 15B are source follower circuits, but may be voltage follower circuits.

As shown in FIGS. 1 and 2, the differential amplifier 14 of the comparator 3 includes the NMOS differential pair circuit 21 including NMOS transistors 21A and 21B, a current source 22, and a current-to-voltage conversion circuit 23.

The gate of the NMOS transistor 21A is connected to the connection point CA. The gate of the NMOS transistor 21B is connected to the connection point CB.

The sources of the two NMOS transistors 21A and 21B are connected to the current source 22. The drains of the two NMOS transistors 21A and 21B are connected to the current-to-voltage conversion circuit 23.

The differential amplifier 14 includes the NMOS differential pair circuit 21 including the NMOS transistors 21A, 21B. The NMOS differential pair circuit 21 receives the reference signal Vref or Vref+ as the first input signal and the input signal Vmon or Vmon+ as the second input signal, and outputs a signal corresponding to the difference between the reference signal Vref and the input signal Vmon, or to the difference between the reference signal Vref+ and the input signal Vmon+.

The current-to-voltage conversion circuit 23 includes an amplifier. When the input signal Vmon is equal to or greater than the reference code signal RC corresponding to the reference signal Vref or is equal to or less than the reference signal Vref, the current-to-voltage conversion circuit generates the detection signal AS based on the currents flowing in the two NMOS transistors 21A and 21B, and outputs the generated detection signal to the control circuit 4.

Operations

Hereinafter, an operation of the voltage monitoring device 1 will be described.

When the reference code signal RC is input to the DAC unit 2, the decoder 11 outputs a selection signal SS, the magnitude of which is based on whether or not the reference code signal RC is equal to or greater than the predetermined value TH.

In this example, for example, it is assumed that the threshold voltage VTH corresponding to the predetermined value TH is half the power supply voltage VDD, that is, a value depending on VDD/2. When the reference code signal RC is equal to or greater than the predetermined value TH, the decoder 11 supplies the selection signal SS for closing the switches 19A and 19B and opening the switches 20A and 20B, of the multiplexers 16A and 16B, thereby communicating the un-shifted Vref and Vmon values to the NMOS differential pair circuit 21. When the reference code signal RC is less than the predetermined value TH, the decoder 11 supplies the selection signal SS for opening the switches 19A and 19B and closing the switches 20A and 20B to the multiplexers 16A and 16B, thereby communicating the shifted Vref+ and Vmon+ values to the NMOS differential pair circuit 21.

That is, the decoder 11 generates a switch position selection signal SS based on the value of the reference code signal RC, outputs the generated selection signal to the multiplexers 16A and 16B, and performs the opening and closing of the switches 19A, 19B, 20A and 20B to selectively supply one of the un-shifted reference signal Vref and the un-shifted input signal Vmon to the NMOS differential pair circuit 21 or the shifted reference signal Vref+ and the shifted input signal Vmon+, to the NMOS differential pair circuit 21.

Thus, when the voltage of the reference signal Vref is less than the voltage VTH, which is a preselected or predetermined threshold voltage, the input circuit 13A raises the voltage of the reference signal Vref to Vref+ and outputs the voltage raised reference signal Vref+ to the NMOS differential pair circuit 21, and the input circuit 13B raises the voltage of the input signal Vmon to Vmon+ and outputs the voltage raised input signal Vref+ to the NMOS differential pair circuit 21.

Specifically, the input circuit 13A supplies the shifted reference signal Vref+ in order to raise the voltage of the reference signal Vref delivered to the NMOS differential pair circuit 21 when the voltage of the un-shifted reference signal Vref is less than the preselected threshold voltage, and supplies the un-shifted reference signal Vref to the NMOS differential pair circuit 21 when the voltage of the reference signal Vref is not less than the preselected reference voltage VTH.

The input circuit 13B supplies the shifted input signal Vmon+ in order to raise the voltage of the un-shifted input signal Vmon to the NMOS differential pair circuit 21 when the voltage of the un-shifted reference signal Vref is less than the preselected threshold voltage VTH, and supplies the un-shifted input signal Vmon to the NMOS differential pair circuit 21 when the voltage of the un-shifted reference signal Vref is not less than the preselected threshold voltage VTH.

Figure 3:
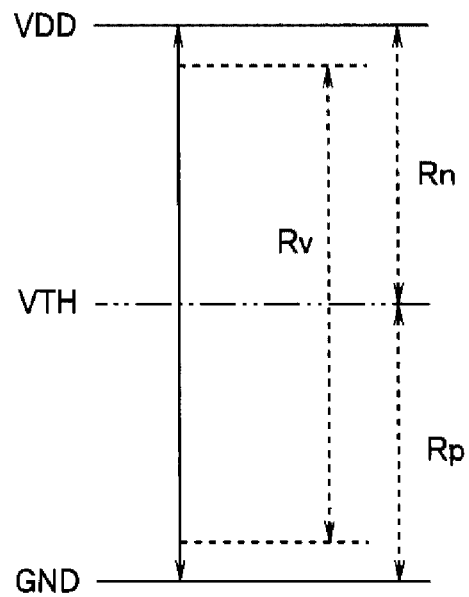
FIG. 3 is a diagram showing the relationship between a reference signal Vref and a threshold voltage VTH according to the embodiment.

FIG. 3 is a diagram showing the relationship between the reference signal Vref and the threshold voltage VTH. In FIG. 3, an arbitrary voltage level within a predetermined range Rv between the power supply voltage (VDD) and the ground (GND) may be used as the reference signal Vref. As described above, the threshold voltage VTH is a voltage level corresponding to the predetermined or preselected value TH of the reference code signal RC.

When the reference signal Vref is equal to or greater than the threshold voltage VTH, the decoder 11 supplies the selection signal SS for closing the switches 19A and 19B and for opening the switches 20A and 20B to the multiplexers 16A and 16B. As a result, the un-shifted reference signal Vref is applied to the gate of the NMOS transistor 21A, and the un-shifted input signal Vmon is applied to the gate of the NMOS transistor 21B.

As shown in FIG. 3, when the reference signal Vref falls within a range Rn from VDD/2 to the power supply voltage VDD, the un-shifted reference signal Vref and the un-shifted input signal Vmon are input to the NMOS differential pair circuit 21, and the detection signal AS is output when the voltage level of the input signal Vmon crosses the voltage level of the reference signal Vref.

When the reference signal Vref is less than the threshold voltage VTH, the decoder 11 supplies the selection signal SS for opening the switches 19A and 19B and for closing the switches 20A and 20B to the multiplexers 16A and 16B. As a result, the output of the buffer circuit 15A Vref+ is applied to the gate of the NMOS transistor 21A, and the output of the buffer circuit 15B Vmon+ is applied to the gate of the NMOS transistor 21B.

Thus, when the voltage levels of the reference signal Vref and the input signal Vmon fall within a range Rp from VDD/2 to ground (GND), the shifted input signal Vmon+ and shifted reference signal Vref+ are input to the NMOS differential pair circuit 21, and the detection signal AS is output when the voltage level of the input signal Vmon falls below the voltage level of the reference signal Vref.

In this example, when the PMOS transistor 18A to which the reference signal Vref is applied is considered, the current Id flowing in the PMOS transistor 18A is expressed by the following expression (1).

$$Id = \tfrac{1}{2} \cdot \beta \cdot (Vgs - Vth)^2 \quad (1)$$

where β is expressed by the following expression (2).

$$\beta = \mu \cdot Cox \cdot W/L \quad (2)$$

Vgs is a voltage between the gate and the source of the PMOS transistor 18A, Vth is a threshold voltage of the PMOS transistor 18A, μ is the mobility of holes, Cox is the capacitance of the gate oxide film, W is the gate width, and L is the gate length of the PMOS transistor.

The voltage Vgs between the gate and the source of the PMOS transistor is expressed by the following expression (3).

$$Vgs = Vout - Vin \quad (3)$$

Vin is a voltage applied to the gate of the PMOS transistor 18A, and Vout is an output voltage of the PMOS transistor 18A, that is, a source voltage.

The source voltage of the PMOS transistor 18A becomes a voltage expressed by the following expression (4) from Expression (1) and Expression (3).

$$Vout = Vin + Vth + \sqrt{\frac{2 \cdot Id}{\beta}} \quad (4)$$

That is, the level of the reference signal Vref which is the gate voltage is shifted by the voltage Vgs between the gate and the source of the PMOS transistor 18A, and thus, the voltage level of the source voltage of the PMOS transistor 18A is raised. Thus, an input range of the NMOS differential pair circuit 21 is lowered toward the ground (GND) by shifting the level of the source voltage by the voltage Vgs between the gate and the source due to the PMOS source follower, and thus, the input range of the NMOS differential pair circuit 21 has the same input range as that of the PMOS differential pair circuit.

The following matters can be seen from Expression (4). The current Id is quantitatively applied from the current source 17A (17B). Since Vth and β are constants determined by the physical parameters of the PMOS transistor 18A (18B), second and third terms on the right-hand side of Expression (4) become constants. This means that a difference between Vout and Vin usually becomes a constant value.

Since the current sources 17A and 18A and the PMOS transistors 18A and 18B are designed such that the current sources are have the same output and the transistors are physically the same, both the constant values of Expression (4) are equal to each other. A difference between the values, interchangeability, or voltage absolute values of the gate inputs of the PMOS transistors 18A and 18B is canceled in Vgs. NBTI degradation is caused in the PMOS transistors 18A and 18B, but a difference between the degrees of the NBTI degradation is negligible if the Vgs values are the same. The transistors are equally degraded by NBTI degradation, and thus, the accuracy of the comparator is not greatly impaired.

That is, when the reference signal Vref is supplied to the gate of any one of the NMOS transistors of the NMOS differential pair circuit depending on the signal level, the un-shifted reference signal is supplied, or the shifted reference signal is supplied. Particularly, when the reference signal Vref is a small value, the level of the reference signal Vref is shifted by the PMOS transistor of which the drain is connected to the ground, and the reference signal Vref+ is supplied to the gate of the NMOS transistor.

Figure 4:
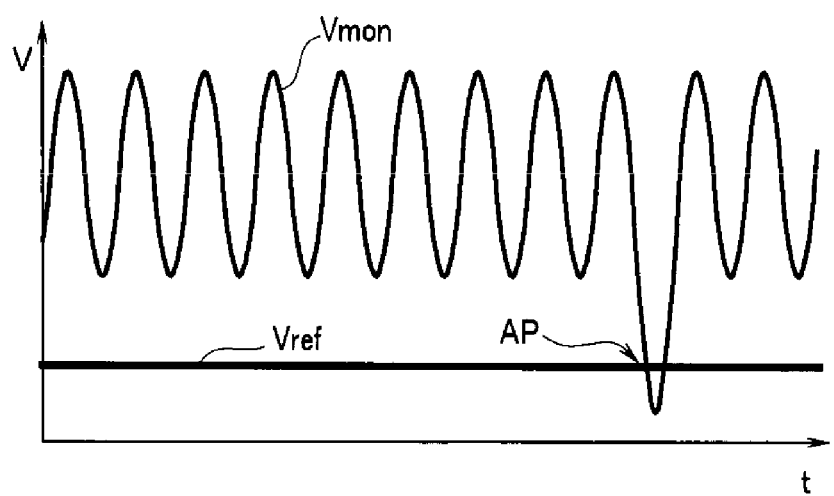
FIG. 4 is a waveform diagram of two input signals for describing an operation of the voltage monitoring circuit according to the embodiment.

FIG. 4 is a waveform diagram of two input signals for describing the operation of the voltage monitoring device 1.

When the voltage level of the input signal Vmon is higher than the voltage level of the reference signal Vref and predetermined changes of the un-shifted input signal Vmon occur in constant cycles, whether the input signal Vmon exceeds the reference signal Vref is monitored. For example, the input signal Vmon is an output signal of a sine wave of a sensor provided at a motor.

That is, when the voltage monitoring device 1 is used for detecting an abnormal voltage, the reference signal Vref has a constant voltage while the input signal Vmon periodically changes with time t.

When the voltage value of the input signal Vmon matches the voltage value of the reference signal Vref, it is determined that an abnormality has occurred, and the detection signal AS as an abnormality detection signal is output to the control circuit 4. In FIG. 4, the abnormality detection signal is output when the voltage Vmon is at point AP, and a voltage abnormality is detected.

As described above, according to the above-described embodiment, it is possible to realize a comparator which is capable of coping with an input signal falling within a wide input voltage range, is minimally influenced by NBTI degradation, and is capable of having a decreased circuit size.

Here, in order to avoid NBTI degradation, a circuit of a comparator that replaces a PMOS differential pair circuit with an NMOS differential pair circuit may be considered. However, in this case, the NMOS differential pair circuit may not be able to receive a signal having a low voltage band approximating the ground because of the difference between the input ranges of the NMOS transistor and the PMOS transistor. So, in order to adjust the input range of the NMOS differential pair circuit, a circuit configuration which includes level shift circuits inserted into gates of two NMOS transistors so that voltage levels of input signals can be shifted up, is suggested.

Moreover, in such configuration an NMOS differential pair circuit is further required to receive a high input voltage approximating the power supply voltage. Therefore, there will be a problem in that a total size of the circuit becomes much larger.

In contrast with the case described above, according to the embodiment, it is possible to realize an input voltage range of a rail-to-rail average of the related art while using the NMOS differential pair circuit, and thus, the circuit size is not increased.

The reference signal Vref is set by the reference code signal RC which is the digital signal. The setting of the reference signal Vref and the switching between the inputs of the multiplexers 16A and 16B are interconnected, and a path of the input circuit corresponding to the voltage level of the reference signal Vref is selected by a user.

In the above-described embodiment, the selection signal SS is generated from the output signal of the decoder 11 of the DAC unit 2, but the selection signal SS may be acquired from the outside of the voltage monitoring device 1.

Two input circuits 13A and 13B are provided in the above-described embodiment, but the input circuit 13B may need not be provided. For example, it is not necessary to shift the input signal Vmon up when the voltage of the input signal Vmon which is the monitoring target is limited to a range from a medium voltage band to a high voltage band which approximates the power supply voltage, and the input circuit 13B may be omitted in this case.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A comparator comprising:
a differential pair circuit consisting of NMOS transistors, the differential pair circuit configured to output a signal corresponding to a difference between first and second input signals supplied thereto; and
a first input circuit configured to raise a voltage of the first input signal supplied to the differential pair circuit when the voltage of the first input signal is less than a predetermined threshold, wherein the first input circuit includes a first level shift circuit configured to:
increase the voltage of the first input signal,
supply the increased voltage first input signal as increased by the first level shift circuit to the differential pair circuit when the level of the first input signal is less than the predetermined threshold, and
supply the first input signal to the differential pair circuit without increasing the voltage thereof when the voltage of the first input signal is not less than the predetermined threshold, wherein
the comparator does not include a differential pair circuit consisting of PMOS transistors.

2. The comparator according to claim 1, further comprising a second input circuit configured to increase the voltage of the second input signal supplied to the differential pair circuit when the voltage of the first input signal is less than the predetermined threshold.

3. The comparator according to claim 2, wherein the second input circuit includes a second level shift circuit configured to:
increase the voltage of the second input signal,
supply the increased voltage second input signal to the differential pair circuit when the voltage of the first input signal is less than the predetermined threshold, and
supply the second input signal to the differential pair circuit without increasing the voltage thereof when the voltage of the first input signal is not less than the predetermined threshold.

4. The comparator according to claim 3, wherein
the first level shift circuit includes a first PMOS transistor,
the second level shift circuit includes a second PMOS transistor,
the first input signal is supplied to the gate of the first PMOS transistor, and
the second input signal is supplied to the gate of the second PMOS transistor.

5. The comparator according to claim 1, further comprising:
a selection circuit configured to:
select the first increased voltage input signal when the voltage of the first input signal, without increasing the voltage thereof, is less than the predetermined threshold voltage,
select the first input signal without increasing the voltage thereof when the voltage level of the first input signal without increasing the voltage thereof is not less than the predetermined threshold voltage, and
supply the resulting selected first input signal to the differential pair circuit.

6. The comparator according to claim 5, further comprising:

a selection instruction circuit configured to output a selection signal to the selection circuit based on a digital version of the first input signal, wherein
the selection circuit selects the increased voltage first input signal or the first input signal without increasing the voltage thereof based on the selection signal, and supplies the selected first input signal to the differential pair circuit.

7. The comparator according to claim 6, further comprising:
a digital-to-analog converter configured to convert the digital version of the first input signal to an analog signal and generate the first input signal therewith.

8. A comparator comprising:
a differential pair circuit consisting of NMOS transistors and configured to output a signal corresponding to a difference between first and second input signals supplied thereto;
a first level shift circuit configured to increase the voltage of the first input signal;
a second level shift circuit configured to increase the voltage of the second input signal;
a first selection circuit configured to select a first input signal as increased in voltage by the first level shift circuit when the voltage of the first input signal prior to the voltage increase is less than a predetermined threshold voltage, select the first input signal prior to the voltage increase when the voltage level of the first input signal prior to the voltage increase is not less than the predetermined threshold voltage, and supply the selected first input signal to the differential pair circuit; and
a second selection circuit configured to select the second input signal increased in voltage by the second level shift circuit when the voltage level of the first input signal prior to the voltage increase is less than the predetermined threshold voltage, select the second input signal prior to the voltage increase when the voltage level of the first input signal prior to the voltage increase is not less than the predetermined threshold voltage, and supply the selected second input signal to the differential pair circuit, wherein
the comparator does not include a differential pair circuit consisting of PMOS transistors.

9. The comparator according to claim 8, further comprising:
a selection signal output circuit configured to output a selection signal to the first selection circuit and the second selection circuit based on a digital version of the first input signal,
wherein the first selection circuit selects the first input signal increased in voltage by the first level shift circuit, or the first input signal prior to the voltage increase, based on the selection signal, and supplies the selected one of the first input signals to the differential pair circuit, and
the second selection circuit selects the second input signal increased in voltage by the second level shift circuit or the second input signal prior to the voltage increase, based on the selection signal, and supplies the selected one of the second input signals to the differential pair circuit.

10. The comparator according to claim 9, further comprising:
a digital-to-analog converter configured to convert the digital version of the first input signal to an analog first input signal.

11. The comparator according to claim 8, wherein
the first level shift circuit includes a first PMOS transistor,
the second level shift circuit includes a second PMOS transistor,
the first input signal is supplied to the gate of the first PMOS transistor, and
the second input signal is supplied to the gate of the second PMOS transistor.

12. The comparator according to claim 11, wherein the differential pair circuit includes a first NMOS transistor and a second NMOS transistor, the gate of the first NMOS transistor is connected to the first selection circuit, and the gate of the second NMOS transistor is connected to the output of the second selection circuit.

13. The comparator according to claim 12, wherein the first selection circuit comprises:
a node connected to the gate of the first NMOS transistor, wherein
the gate of the first PMOS transistor is selectively connectable to the node through a switching mechanism;
the source of the first PMOS transistor is selectively connectable to the node through a switching mechanism; and
the switching mechanism selectively connects only one of the source and the gate of the first PMOS transistor to the node.

14. The comparator according to claim 13, further comprising:
a decoder connected to the switching mechanism, the decoder configured to receive a reference code signal, and based upon the magnitude thereof, send a selection signal to the switching mechanism to cause the switch to select which of the gate and the source of the first PMOS transistor is connected to the node based on the selection signal.

15. A comparator, comprising:
a differential pair circuit consisting of a first NMOS transistor and a second NMOS transistor, the drains of the first and second NMOS transistors are connected to a current-to-voltage conversion circuit, the sources of the first and second NMOS transistors connected to a first current source;
a first selector circuit comprising a first node connected to the gate of the first NMOS transistor, the first node being selectively connected to one of the source or the gate of a first PMOS transistor; and
a second selector circuit comprising a second node connected to the gate of the second NMOS transistor, the second node being selectively connected to one of the source or the gate of a second PMOS transistor, wherein
the comparator does not include a differential pair circuit consisting of PMOS transistors.

16. The comparator according to claim 15, further comprising a power supply voltage source and a second current source connected in series to the source of the first PMOS transistor.

17. The comparator according to claim 16, wherein the drain of the first PMOS transistor is connected to ground.

18. The comparator according to claim 17, further comprising a digital-to-analog converter having a digital reference signal input and an analog reference signal output, the analog reference signal output being connected to the gate of the first PMOS transistor.

19. The comparator according to claim 15, wherein threshold voltages of the first and second PMOS transistors are equal.

* * * * *